US006972069B2

(12) United States Patent
Hecht et al.

(10) Patent No.: US 6,972,069 B2
(45) Date of Patent: Dec. 6, 2005

(54) DEVICE AND METHOD FOR CONNECTING TWO WAFERS IN A PLANAR MANNER FOR GRINDING DOWN AND CUTTING UP A PRODUCT WAFER

(75) Inventors: Franz Hecht, Bernhardswald (DE); Werner Kröninger, Neutraubling (DE); Melanie Lutzke, Ingolstadt (DE)

(73) Assignee: Infineon Technologies AG, Munich (DE)

( * ) Notice: Subject to any disclaimer, the term of this patent is extended or adjusted under 35 U.S.C. 154(b) by 286 days.

(21) Appl. No.: 10/403,877

(22) Filed: Mar. 31, 2003

(65) Prior Publication Data

US 2003/0173017 A1    Sep. 18, 2003

Related U.S. Application Data

(63) Continuation of application No. PCT/DE01/03683, filed on Sep. 26, 2001.

(30) Foreign Application Priority Data

Sep. 29, 2000 (DE) ............................... 100 48 881

(51) Int. Cl.⁷ ............................................. B29C 65/48
(52) U.S. Cl. ..................... 156/286; 438/455; 438/458; 438/464; 156/285
(58) Field of Search ............................... 156/285, 286, 156/382; 438/455, 456, 458, 459, 464; 269/21; G11B 7/24, 7/26

(56) References Cited

U.S. PATENT DOCUMENTS

| | | | |
|---|---|---|---|
| 4,283,242 A | * | 8/1981 | Regler et al. ............... 156/154 |
| 4,316,757 A | | 2/1982 | Walsh |
| 5,169,472 A | | 12/1992 | Goebel |
| 5,273,553 A | | 12/1993 | Hoshi et al. |
| 5,300,175 A | | 4/1994 | Gardner et al. |
| 5,447,596 A | | 9/1995 | Hayase |
| 5,545,283 A | | 8/1996 | Collins et al. |
| 5,800,667 A | | 9/1998 | Kosaki et al. |
| 6,045,073 A | | 4/2000 | Ikuta |
| 6,309,505 B1 | | 10/2001 | Takisawa et al. |
| 6,398,892 B1 | | 6/2002 | Noguchi et al. |
| 2003/0070765 A1 | * | 4/2003 | Eichlseder .................. 156/580 |

FOREIGN PATENT DOCUMENTS

| | | |
|---|---|---|
| DE | 196 10 112 A1 | 9/1997 |
| DE | 197 07 771 A1 | 1/1998 |
| DE | 19715779 A1 * 10/1998 | ............. C09J 5/00 |
| DE | 197 55 088 A1 | 6/1999 |
| DE | 199 40 390 A1 | 3/2000 |
| EP | 0 865 073 A2 | 9/1998 |
| JP | 02123726 A | 5/1990 |

* cited by examiner

Primary Examiner—Jessica Rossi
Assistant Examiner—Jayme L. Brown
(74) Attorney, Agent, or Firm—Laurence A. Greenberg; Werner H. Stemer; Ralph E. Locher

(57) ABSTRACT

A device for connecting two wafers in a planar manner for grinding down and cutting up a product wafer has a vacuum chamber, a chuck for receiving a carrier wafer, a heating device for heating up the chuck and a vacuum-chamber cover with a vacuum-holding device, on which a product wafer can be arranged suspended above the carrier wafer. After the evacuation of the vacuum chamber, the active surface of the product wafer is dropped onto a double-sided adhesive film on the carrier wafer and is pressed into place by the rising pressure during air admission. The result is that the wafers are connected together.

8 Claims, 3 Drawing Sheets

DEVICE AND METHOD FOR CONNECTING TWO WAFERS IN A PLANAR MANNER FOR GRINDING DOWN AND CUTTING UP A PRODUCT WAFER

CROSS-REFERENCE TO RELATED APPLICATION

This application is a continuation of copending International Application No. PCT/DE01/03683, filed Sep. 26, 2001, which designated the United States and was not published in English.

BACKGROUND OF THE INVENTION

Field of the Invention

The invention relates to a device for connecting two wafers in a planar manner and to a method for connecting two wafers in a planar manner for grinding down and cutting up a product wafer.

U.S. Pat. No. 6,045,073 discloses a method for grinding down semiconductor chips, in which the active surfaces of the chips are initially connected electrically to a contact surface of a leadframe via contact bumps and the edge regions thereof are encapsulated in a silicone composition. Subsequently, the silicon remains are removed from the rear side of the chips and the rear side of a chip is subjected to a plasma etching process, in order to etch the chip down to a few $\mu$m.

This method has the disadvantage that the etching down cannot be used simultaneously for many chips on a wafer of a large surface area, but is merely restricted to relatively small surface areas of an individual chip. The restriction of the previous solutions to the etching down of individual chips is essentially attributable to the fact that it is problematic for a carrier of a large surface area to be connected in a planar manner to a wafer of a large surface area. Even minor deviations in the parallelism of the carrier and the wafer result in considerable differences in thickness from one edge region of the wafer to the other edge region, so that uniform etching down of the entire wafer to a few $\mu$m cannot be accomplished with the previously known method, especially since commercially available wafers have a diameter of 150 to 300 mm.

SUMMARY OF THE INVENTION

It is accordingly an object of the invention to provide a device for connecting two wafers in a planar manner and a method for connecting two wafers in a planar manner for grinding down and cutting up a product wafer, which overcome the above-mentioned disadvantages of the prior art apparatus and methods of this general type.

In particular, it is an object of the invention to provide a device and a method for connecting two wafers in a planar manner such that a product wafer can be ground down and then cut up without having to first cut up the product wafer into chips and then etch the rear sides of the chips while each chip is in a corresponding carrier material or in a corresponding semiconductor package. In addition, the invention is intended to provide a method with which it is possible for two wafers to be connected in a planar manner with high precision, without instances of warpage, bowing, sloping, or other large-area defects occurring during the connection.

With the foregoing and other objects in view there is provided, in accordance with the invention, a device for connecting two wafers one on top of another in a planar manner. The device includes: a vacuum chamber having a chamber volume and an evacuating device for the chamber volume; a chuck having an evacuating device for receiving a carrier wafer having a surface with a double-sided adhesive film or an adhesive layer; a heating device for heating up the chuck; and a vacuum-chamber cover having a vacuum-holding device for holding a product wafer having a surface. The vacuum-holding device is configured on the vacuum-chamber cover for suspending the product wafer in the vacuum chamber at a distance above the carrier wafer such that the surface of the product wafer and the surface of the carrier wafer are congruent before being connected.

With the foregoing and other objects in view there is also provided, in accordance with the invention, a method for connecting a product wafer and a carrier wafer in a planar manner. The method includes steps of: attaching a double-sided adhesive film or an adhesive layer onto the carrier wafer; placing the carrier wafer between positioning pins on a chuck of a vacuum chamber; placing the product wafer between guiding pins of a vacuum-holding device of a vacuum-chamber cover and fixing the product wafer by opening a first vacuum valve connecting the vacuum-holding device to an evacuating device; closing the vacuum chamber and evacuating the vacuum chamber to an equal or higher vacuum than a vacuum of the vacuum-holding device by opening a second vacuum valve; and after closing at least the first vacuum valve and the second vacuum valve and opening air-admitting orifices, admitting air into the vacuum chamber such that the carrier wafer and the product wafer are simultaneously pressed onto each other in a planar manner by rising pressure in the vacuum chamber.

According to the invention, the device for connecting two wafers one on top of the other in a planar manner includes a vacuum chamber with an evacuating device for the chamber volume, a chuck with an evacuating device for receiving a carrier wafer with double-sided adhesive film or an adhesive layer provided on one side of the carrier wafer, a heating device for heating up the chuck, and a vacuum-chamber cover with a vacuum-holding device for a product wafer. The vacuum-holding device is arranged on the vacuum-chamber cover in such a way that the product wafer is arranged suspended in the vacuum chamber at a distance above the carrier wafer, with congruent surface areas, before the product wafer and the carrier wafer are connected.

This device has the advantage that the distance or intermediate space between a product wafer held by the vacuum-holding device and the adhering surface of the double-sided adhesive film on the carrier wafer, arranged underneath the product wafer on a chuck and having a double-sided adhesive film, can be evacuated completely, so that no contamination and no microscopic gas bubbles can impair the planarity between the two wafers. A further advantage of this device is that the product wafer held by a vacuum-holding device is arranged in a suspended manner, and consequently with its active surface directed downward, so that no dust or other contamination particles can settle on the surface before the surface comes into contact with the double-sided adhesive film. A further advantage of this invention is that, at the instant at which extraction pumping causes the vacuum in the vacuum chamber to become less than the vacuum by which the product wafer is held suspended over the carrier wafer, the product wafer automatically falls down from its vacuum securement and can be set down flat on the double-sided adhesive film without any gas pocket. A further advantage of this device is that the product wafer can overcome the distance between the product wafer and the double-sided adhesive film in free fall without any canting and falls onto the film in a planar manner.

To ensure reliable setting down of the product wafer on the double-sided adhesive film of the carrier wafer, in one embodiment of the invention, the vacuum-holding device has guiding pins, which protrude perpendicularly from its surface and are conically shaped. These cone bases area of the guiding pins are positioned on the vacuum-holding device, while the cone tips protrude from the vacuum-holding device. This arrangement has the advantage that the product wafer can fall down unhindered, and yet guided, by the guiding pins from the vacuum-holding device on the vacuum-chamber cover automatically and in a plane-parallel manner, without canting or catching on the guiding pins, since in this embodiment they are conically shaped.

To ensure this reliable guidance, the guiding pins of the vacuum-holding device are arranged in the edge region of the product wafer. At the same time, the guiding pins of the vacuum-holding device are arranged with respect to the chuck which carries the carrier wafer in such a way that precise and aligned setting-down and receiving of the product wafer on the double-sided adhesive film or on the adhesive layer of the carrier wafer on the chuck is ensured. This is achieved on the one hand by the vacuum-chamber cover being precisely brought together with the vacuum chamber and on the other hand by the product wafer being placed exactly between the guiding pins.

For controlling the individual method steps, vacuum valves are provided in the vacuum lines and in the connections between one or more evacuating devices.

In a further embodiment of the invention, the device includes a first vacuum valve configured between an evacuating device of the vacuum-holding device and the vacuum-chamber cover, a second vacuum valve configured between the evacuating device for the chamber volume and the vacuum chamber, and a third vacuum valve configured between the evacuating device of the chuck and the chuck. With these vacuum valves, the individual process steps can be controlled and the positions both of the carrier wafer and of the product wafer can be reliably handled.

In one embodiment of the invention, at least three guiding pins are arranged on the vacuum-holding device, since three guiding pins allow clear fixing to take place in the X and Y directions. An improved version of the device provides that at least five guiding pins are arranged on the vacuum-holding device. With five guiding pins for one wafer in each case, the latter is reliably secured against slipping, canting, shifting or becoming displaced in some other way.

A further embodiment of the invention provides that the guiding pins are of a length which corresponds at least to the thickness of the product wafer plus the distance between the product wafer and the double-sided adhesive film or the adhesive layer, and which is less than the distance between the surface of the vacuum-holding device of the vacuum cover and the surface of the chuck. In this case, the distance between the product wafer suspended from the vacuum-holding device and the carrier wafer lying on the chuck is dimensioned in such a way that reliable vacuum-drying of the opposing surfaces is possible, so that the surface of the double-sided adhesive film can completely outgas, and the opposite side of the product wafer has a completely dry surface and, after the evacuation of the vacuum chamber, there are no gases between the surfaces to be adhesively bonded. The distance depends, furthermore, on the size of the opposing surface areas. The larger these surface areas are, the greater the extraction-pumping cross section must be chosen, and consequently the greater the distance between the wafers must be set. In a further embodiment of the invention, the distance for 6 to 12-inch wafers (150 to 300 mm) lies between 3 and 15 millimeters. In the case of wafers of up to 6 inches, the distance can be reduced to one millimeter.

A further embodiment of the invention provides that the cone base areas of the guiding pins have a diameter of 200 $\mu$m to 1200 $\mu$m and at the cone tips have a diameter of between 100 and 500 $\mu$m. Such slender and thin pins have the advantage that they are extremely compliant and induce the lowest possible stresses in the product wafer during the guidance of the product wafer.

In a further embodiment of the invention, the vacuum-holding device has depressions that can be connected to an evacuating device via a first vacuum valve. Depressions of this type are formed in the vacuum-holding device as concentric grooves and have, in their groove base, drilled holes that communicate with the evacuating device for the vacuum-holding device. With this embodiment it is ensured that the rear side of the product wafer is subjected to a vacuum over a large surface area and is suspended from the vacuum-chamber cover in a planar manner on the surface of the vacuum-holding device.

A further embodiment of the invention provides that the chuck has positioning pins, which protrude perpendicularly from the surface of the chuck. These positioning pins may be designed in a way similar to the guiding pins for the product wafer, whereby the same advantages are also obtained for the carrier wafer. On the other hand, the carrier wafer does not have to be guided over the distance between the carrier wafer and the product wafer. To this extent, the positioning pins may also have cylindrical shapes and be of a length that is less than or equal to the thickness of the carrier wafer. Conical forming of the positioning pins allows them to protrude beyond the carrier wafer and contribute to the guiding into place of the product wafer. For this purpose, the positioning pins of the chuck are arranged with respect to the vacuum-holding device in such a way that precise and aligned setting-down and receiving of the product wafer on the double-sided adhesive film or on the adhesive layer of the carrier wafer on the chuck is ensured.

In particular if both guiding pins and positioning pins protrude beyond the respective wafer surfaces, they are not only conically shaped in an advantageous way, but should not exceed the thickness of the respective wafer plus the distance lying between the wafers, to ensure that neither the guiding pins nor the positioning pins touch the surfaces of the chuck lying opposite or the vacuum-holding device lying opposite.

In a preferred embodiment, the positioning pins are cylindrically formed and are of a smaller length than the thickness of the carrier wafer. This is permissible, since in this embodiment they do not contribute to the guiding of the product wafer, but align the carrier wafer in relation to the product wafer exactly and with congruent surfaces.

If the sum of the lengths of the positioning pins and guiding pins together exceeds the distance between the surface of the chuck and the surface of the vacuum-holding device, in a further embodiment of the invention, the positioning pins are arranged offset from the guiding pins with respect to the edge of the wafers to be connected. It is consequently ensured at the same time that positioning and guiding pins cannot collide with one another. Both the chuck and the vacuum-holding device have fastening possibilities for the positioning pins and guiding pins, which allow adaptation to the respective size of a wafer.

In a further embodiment of the invention, the device has a heater, which is arranged on the chuck and permits heating of the chuck to between 60 and 200° C. The vacuum-holding device may also have a further heater, to assist outgassing of the surface of the product wafer.

A method for connecting two wafers in a planar manner for grinding down and cutting up a product wafer, the one wafer being a carrier wafer with a double-sided adhesive film or with an adhesive layer and the second wafer being a product wafer, has the following method steps:

drawing the double-sided adhesive film or the adhesive layer onto the carrier wafer;

placing the carrier wafer between positioning pins on a chuck of a vacuum chamber;

placing the product wafer between guiding pins of a vacuum-holding device of a vacuum-chamber cover and fixing the product wafer by opening a first vacuum valve that connects the vacuum-holding device to an evacuating device;

closing the vacuum chamber and evacuating the vacuum chamber to an equal or higher vacuum than the vacuum of the vacuum-holding device by opening a second vacuum valve;

admitting air into the vacuum chamber after closing the vacuum valves and opening air-admitting orifices, with the wafers simultaneously being pressed one onto the other in a planar manner by the rising pressure in the vacuum chamber.

This method has the advantage that, without mechanical aids, after closing the vacuum chamber and evacuating the vacuum chamber to the same or a higher vacuum than the vacuum of the vacuum-holding device, the product wafer, held in a suspended manner by the vacuum-holding device on the vacuum-chamber cover, falls down from the vacuum-holding device and drops in a planar manner onto the surface facing it of the double-sided adhesive film on the carrier wafer. During this falling, the product wafer is guided by the guiding pins arranged around its edge, so that it is neither laterally displaced nor canted as it falls down. For this purpose, the guiding pins, as stated above, are conically shaped and, on account of their length, bridge the distance between the vacuum-holding device and the surface of the double-sided adhesive film on the carrier wafer. Furthermore, this method has the advantage that the active surface of the product wafer can be held at a distance from the surface of the double-sided adhesive film on the carrier wafer, which for its part is arranged on the chuck, so that during the evacuation phase of the vacuum chamber the intermediate space between the two surfaces can outgas completely and the surfaces of the product wafer and the double-sided adhesive film to be brought together are vacuum-dried.

The pumping cross section between the two surfaces for the applied and increasing vacuum of the vacuum chamber can be adapted by the distance between the two surfaces to the requirements of the outgassing and vacuum drying and to the requirement for complete evacuation of the intermediate space between the product wafer and the double-sided adhesive film. The extraction-pumping cross section is in this case the generated surface of the intermediate space between the surface of the product wafer and the surface of the double-sided adhesive film along the outer edge of the product wafer. Consequently, the extraction-pumping cross section is determined by the distance between the product wafer surface and the double-sided adhesive film and also the size of the product wafer. A further advantage of the inventive device is that the extraction-pumping cross section can be adapted to the requirements of the process by increasing the distance between the product wafer and the double-sided adhesive film. For instance, to reduce the extraction-pumping time and consequently the production time, it is possible to increase the extraction-pumping cross section by increasing the distance when there is adequate capacity of the evacuating device and reduce the extraction-pumping cross section when the extraction-pumping time lasts longer on account of a reduced capacity of the evacuating device.

In an example of how the method is carried out, the step of grinding down the product wafer, which has been adhesively attached in a planar manner, to a thickness below 100 $\mu$m is additionally carried out. On account of the method of connecting a carrier wafer to the product wafer to be ground down, with thickness variations limited to a few $\mu$m over the size of the product wafer surface area, this grinding down can be performed in a corresponding automatic grinding-down machine. Every deviation during the connecting of the two wafers in a planar manner from their plane-parallelism has an effect on the uniformity of the thickness of the ground-down wafer. Since, however, on account of the method, the active surface area of the product wafer is brought onto the double-sided adhesive film under a vacuum, there is no possibility of causing gas bubble formations between the wafers by residual gas pockets. These gas bubble formations if present could be the cause of a non-planar connection between the product wafer and the carrier wafer.

In a further example of how the invention is carried out, the product wafer that has been ground-down to below 100 $\mu$m is etched down to a thickness of as little as 15 $\mu$m. This method variant has the advantage that, with wafers becoming increasingly thinner, etching/mechanical grinding down is no longer carried out much below 100 $\mu$m and instead there is a trend toward thinning down purely by etching, without any mechanical loading, for thinning to 15 $\mu$m. After etching down the product wafer, it is still connected, as before, to the carrier wafer, so that it is mechanically supported by the carrier wafer.

Cutting up the product wafer into individual chips can be performed both with and without the adhesively attached carrier wafer. If the carrier wafer is separated from the product wafer before the cutting or sawing of the product wafer into individual chips, the product wafer connected to the carrier wafer is still adhesively fixed beforehand onto a saw frame covered with film, and then the carrier wafer is heated by heating up a chuck above the release temperature for the film or the adhesive, for example, to at least 120° C., for detaching the double-sided adhesive film and for removing the carrier wafer. After that, the ground-down and etched product wafer in the covered saw frame can be cut up into individual chips. The release temperature is understood as meaning a temperature at which the adhesiveness subsides and the product wafer can be detached from the carrier wafer. The release temperature may well be below the melting temperature of the double-sided adhesive film or the adhesive layer.

In the case of a variant of the method for cutting up the ground-down product wafer into individual chips, initially the wafer assembly including a ground-down and etched-down product wafer and a carrier wafer undergoes a cutting-up step, in which the ground-down and etched-down product wafer is cut up into chips, and subsequently the entire composite wafer is adhesively fixed onto a carrier film. The ground-down and etched-down, and now separated, chips are adhesively fixed onto the carrier film. To remove the carrier wafer holding the chips, the assembly including the composite wafer and the double-sided adhesive film is heated up to the melting temperature of the double-sided adhesive film and the carrier wafer is pulled off from the complete assembly, so that subsequently the ground-down and etched-down chips stuck on a carrier film are available for further processing. This method has the advantage that the cutting up of the ground-down and etched-down product wafer into chips can be carried out by sawing cutting-up methods, in which a wafer is divided into chips.

A further variant provides that, even before it is introduced into the device for connecting it to a carrier wafer, the surface of the product wafer is provided with sawing grooves that already divide up the surface of the product wafer into individual chip areas to a depth of down to 100 µm, so that after the grinding-down and etching-down of the product wafer the latter is automatically in a form in which it is cut up into individual chips on the carrier wafer.

Consequently, the method has the advantage that all three variants of cutting up a product wafer into chips involving grinding down and etching down the product wafer can be carried out. The method for connecting a product wafer to a carrier wafer in a planar manner by a double-sided adhesive film consequently improves the prospects of successfully grinding-down, etching-down, and cutting up a product wafer into individual ground-down and etched-down chips.

Consequently, with the method, the product wafer and the carrier wafer are bonded by a double-sided adhesive film in a vacuum chamber. A ground dummy wafer may be used as the carrier wafer. The double-sided adhesive film is used as the connecting adhesive. First, a carrier wafer with the adhesive which will later connect the device wafer or product wafer and the carrier wafer is introduced into the chamber.

To center the product wafer and the carrier wafer without any offset, conical pins are used. The device wafer is sucked into place on the wafer rear side by a vacuum (vacuum 1). The chamber is then evacuated (vacuum 2). By equalizing the pressure, vacuum 1 loses its holding force and the product wafer falls onto the carrier, guided by the conically tapering pins or guiding pins. By subsequently admitting air, the product wafer is then uniformly loaded and pressed onto the carrier wafer, which leads to a firm connection. No punch is used for pressing the device wafer.

Thinning the product wafers far below 100 micrometers requires a carrier wafer that is firmly connected to the product wafer during the thinning, and gives it the necessary stability. Dummy wafers or ceramic wafers may be used as materials for the carrier wafer. It is least expensive to use a pre-ground dummy wafer as the carrier wafer. The pre-grinding ensures a constant thickness, uniformity, and surface quality of the carrier wafer.

The product wafer and the carrier wafer are adhesively attached one on top of the other by a double-sided adhesive, thermally releasable film. After the thinning of the carrier wafer, the product wafer is released again by heat exposure. At about 120 degrees Celsius, the double-sided adhesive film loses its adhesive force. This film can be stored in the rolled-up state with two covering films.

As the first product wafer, finger-tip wafers were thinned to 80 micrometers, 60 micrometers and 40 micrometers. The wafers were sawn into beforehand (bevel cut before thinning). In this case, the separated chips were subsequently supplied on leadframes.

The basic module of the device is a vacuum chamber, which is equipped for vacuum-connecting two wafers. The device for connecting wafers in a planar manner permits carrier wafers on product wafers to be handled with a throughput of about 15 wafers per hour. The composite wafers produced by the device can still be handled when the product wafer is in an extremely thin state. The product wafer on the composite wafer can be ground down to about 70 micrometers. Further removal of the product wafer can be performed by etching.

Other features which are considered as characteristic for the invention are set forth in the appended claims.

Although the invention is illustrated and described herein as embodied in a device and method for connecting two wafers in a planar manner for grinding down and cutting up a product wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
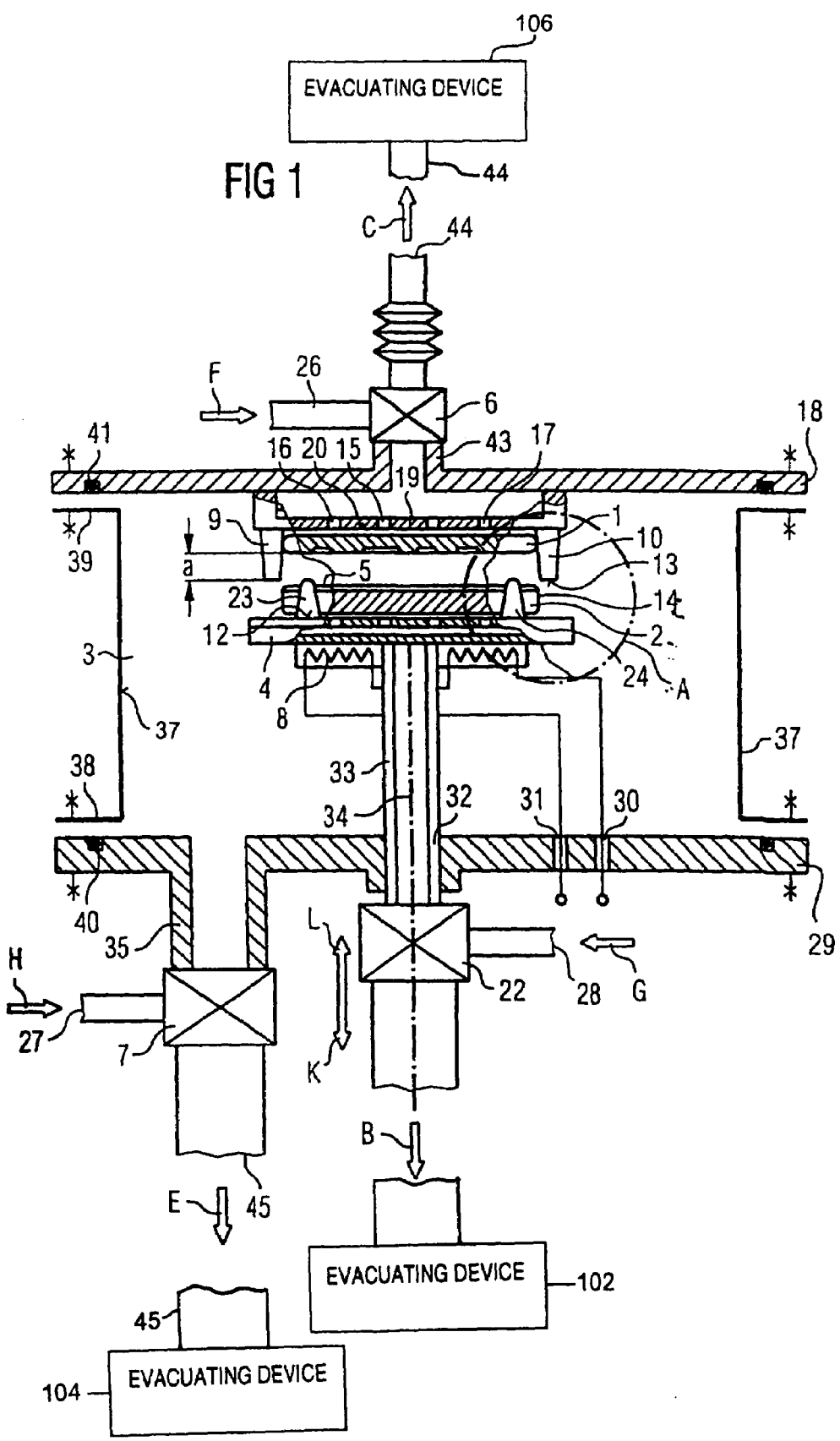
FIG. 1 is a basic diagram of a device for connecting two wafers one on top of the other in a planar manner.

Referring now to the figures of the drawing in detail and first, particularly, to FIG. 1 thereof, there is shown a basic diagram of a device for connecting two wafers 1, 2 one on top of the other in a planar manner. In FIG. 1, the reference numeral 3 designates a vacuum chamber, which is connected to an evacuating device 104 for the chamber volume. The reference numeral 4 designates a chuck, which is likewise connected to an evacuating device 102 and can receive a carrier wafer 2 on its surface 12. The carrier wafer 2 has an edge region 14. The reference numeral 5 shows a double-sided adhesive film, which in FIG. 1 is connected by one of its adhesive surfaces to the carrier wafer 1. Numeral 8 designates a heating device, which is capable of heating up the chuck 4 to the melting temperature of the double-sided adhesive film 5.

The vacuum chamber 3 is closed off in the downward direction by a vacuum base plate 29 having a number of lead-throughs. The lead-throughs 30 and 31 are power lead-throughs for the heating device 8 of the chuck 4. Arranged in the center of the vacuum base plate 29 is a lifting-turning lead-through 32 that can be used to adjust the height of the chuck 4 and, if required, to turn the chuck 4. This lifting-turning device has a piece of pipe 33 which leads from a vacuum valve 22 to the evacuating device 102 of the chuck 4. The pipe 33 also serves as a vacuum line 34. Air can be admitted to the interior of the piece of pipe 33 via an air-admission orifice 28, when the vacuum valve 22 is closed, and consequently the connection to the evacuating device 102 is interrupted.

The vacuum base plate 29 additionally has a pipe connector 35, via which the vacuum chamber 3 can be connected to the evacuating device 104 via a vacuum line 45 after the vacuum valve 7 has been opened. Air can be admitted to the vacuum chamber 3 via an air-admission orifice 27 when the vacuum valve 7 is closed. Arranged on the vacuum base plate 29 is a piece of pipe 37 with a lower flange 38 and an upper flange 39, which forms a vacuum chamber wall. The lower flange 38 is connected in a vacuum-tight manner to the vacuum base plate 29 by means of an O-ring 40. The upper flange 39 carries a vacuum-chamber cover 18, which for its part is connected in a vacuum-tight manner to the upper flange 39 by means of an O-ring 41.

Arranged on the vacuum-chamber cover 18 is a vacuum-holding device 19 having a surface 20 on which the rear side of a product wafer can be held suspended so that its active surface 42 is at a distance a from the second adhesive surface of the double-sided adhesive film 5. The vacuum-holding device 19 is connected to an evacuating device 106 via a vacuum line 44, a pipe connector 43, and a vacuum valve 6, and these components are used to evacuate the vacuum-holding device 19. Air can be admitted to the vacuum-holding device 19 via an air-admission orifice 26 when the vacuum valve 6 is closed.

Arranging a vacuum-holding device 19 on a vacuum-chamber cover 18 makes it possible to arrange a product wafer 1 with its active surface 42 lying opposite a carrier wafer at a distance a, so that the intermediate space formed by the distance a between the product wafer 1 and the carrier wafer 2 can be completely evacuated and outgassed and, if required, the surfaces of the product wafer to be connected to one of the surfaces of the double-sided adhesive film 5 can be vacuum-dried before connecting. It is consequently possible to bring these surfaces onto each other only after this vacuum preparation of the surfaces, in that for example extraction pumping via the vacuum valve 7 and the vacuum line 45 causes the vacuum in the vacuum chamber 3 to become greater than the vacuum which is acting on the vacuum-holding device 19 via the vacuum line 44 and the vacuum valve 6. This is because, with an equal or greater vacuum in the vacuum chamber in comparison with the vacuum of the vacuum-holding device 19, the product wafer falls from its suspended position with its active surface onto the double-sided adhesive film 5 and, during the subsequent admission of air to the vacuum chamber via the air-admission orifice 27 with the vacuum valves 5, 7 and 22 closed at the same time, is pressed by the rising pressure in the vacuum chamber 3 onto the carrier wafer.

Figure 2:
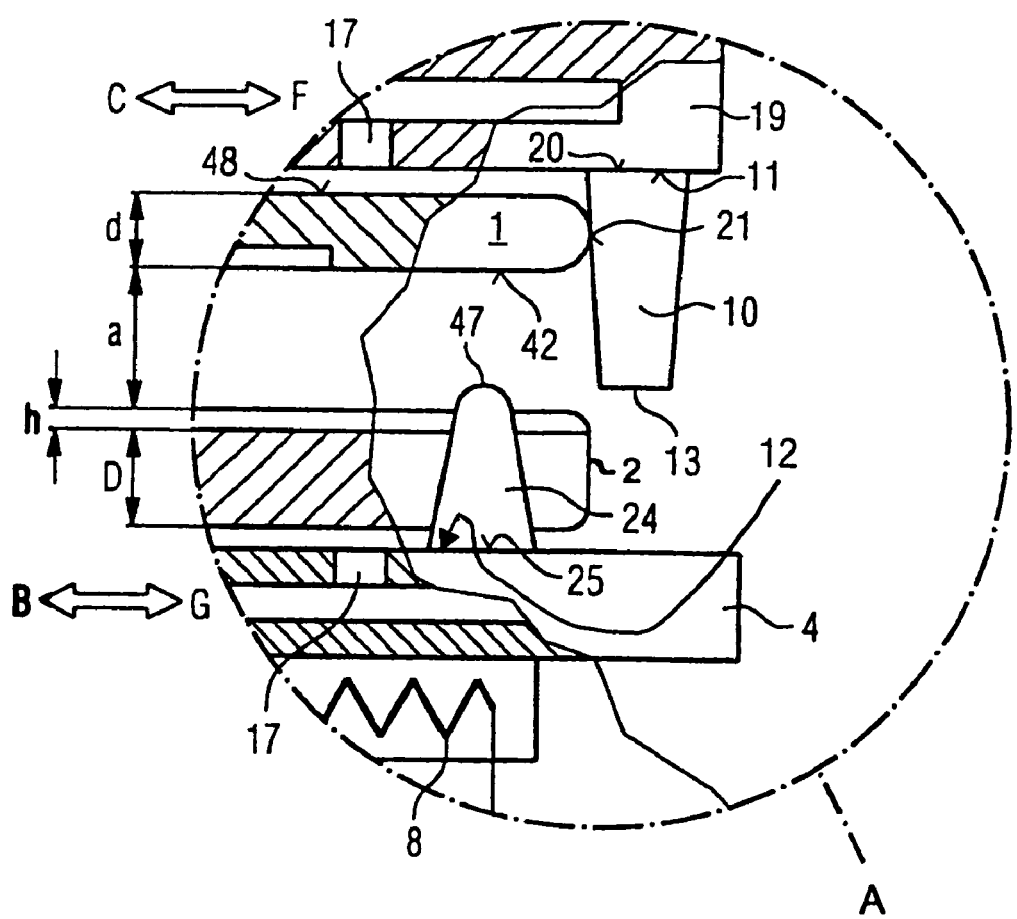
FIG. 2 is a portion of a device for connecting two wafers one on top of the other in a planar manner.

FIG. 2 shows a detail A of a device for connecting two wafers 1 and 2 one on top of the other in a planar manner. For this purpose, the carrier wafer 2 is arranged with its thickness D on the chuck 4 shown in FIG. 1, which is shown here in the form of a detail and partly in cross section. The chuck 4 can be heated up by a heating device 8. Furthermore, the chuck 4 can be evacuated in the direction of the arrow B, so that the carrier wafer 2 can be held on the chuck 4 using the drilled vacuum holes 17. The exact position of the carrier wafer 2 on the chuck 4 is determined by means of positioning pins 23, 24, of which one positioning pin 24 is shown in this detail A. A positioning pin 24 of this type may have a cylindrical shape, as long as its length does not exceed the thickness D of the carrier wafer 2 plus the thickness h of the double-sided adhesive film 5. In the embodiment depicted in the detail A, the positioning pin 24 has a conical shape and is located with its cone base area 25 on the surface 12 of the chuck 4 and protrudes with its cone tip 47 from the surface 12. The conical configuration of the positioning pin 24 has the advantage that the cone tip 47 can contribute to the guiding and positioning of the product wafer 1.

The detail A additionally shows a partial cross section of the vacuum-holding device 19, with which a product wafer 1 can be held with its rear side 48 on the vacuum-chamber cover 18, which is shown in FIG. 1. The vacuum-holding device 19 is evacuated in the direction of the arrow C, whereby the rear side 48 of the product wafer 1 is pressed onto the surface 20 of the vacuum-holding device. For this purpose, the vacuum-holding device 19 has drilled vacuum holes 17 (also identified with numerals 15 and 16 in FIG. 1), which, in an embodiment not shown, can be made in the vacuum-holding device 19 in concentrically arranged grooves. Exact positioning of the product wafer 1 during the holding by the vacuum-holding device 19 and during the method of connecting two wafers is achieved by conical guiding pins 9 and 10 that are configured near the edge region 21 of the product wafer 1, of which the conical guiding pin 10 is shown in the detail A. Its length bridges the distance a between the surface 42 of the product wafer 1 and the surface of the double-sided adhesive film 5. The conical form of the guiding pin 10 ensures that, when the product wafer falls down onto the double-sided adhesive film 5, canting of the wafer on the guiding pin 10 is avoided. Furthermore, the detail A shows that the guiding pin 10 of the holding device 19 is arranged offset from the positioning pin 24 on the circumference of the wafer, so that the pins are not a hindrance during the adhesive attachment and connecting of the product wafer 1. The guiding pin 10 has a cone tip 13 and a conical basearea 11.

Since the device which is shown in FIG. 1 has the possibility of adjusting the height of the chuck 4 via the lifting and turning lead-through 32, it may well be of advantage to align the guiding pins and the positioning pins exactly with one another, so that it is ensured that, when the chuck 4 is moved up in the direction of the vacuum-holding device 19, a minimum distance a is ensured and the two wafers 1, 2 are not inadvertently pressed onto each other before the evacuation.

A further advantage of the device shown in FIGS. 1 and 2 is that the distance a can be varied during the operation of connecting two wafers 1, 2 for grinding down and subsequently cutting up a product wafer 1. For instance, the extraction-pumping cross section can be kept large at the beginning of the operation, in that the lifting device of the chuck 4 is arranged in its lowest position, and the distance a can be reduced to a few millimeters, by raising the chuck using the lifting-turning device 32, before the falling down of the product wafer 1, i.e. as long as the vacuum in the vacuum chamber 3 has not yet reached the vacuum of the vacuum-holding device 19. By bringing the two surfaces to be connected together, that is the active surface 48 of the product wafer 1 and the free surface of the double-sided adhesive film 5, the risk that the falling-down product wafer 1 will undergo canting is minimized when there is an equal or higher vacuum in the vacuum chamber 3 in comparison with the vacuum of the vacuum-holding device 19.

Figure 3:
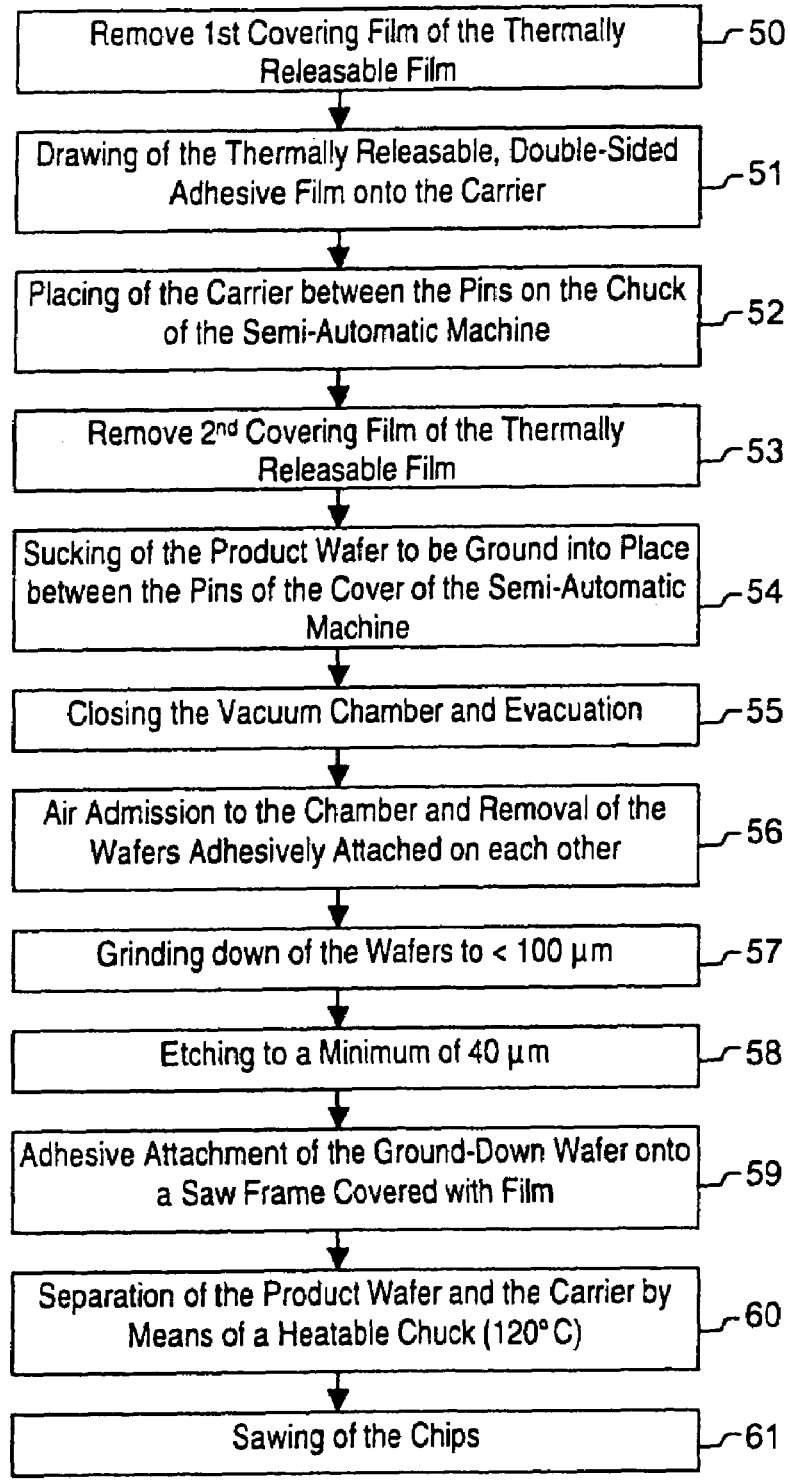
FIG. 3 is a flow diagram showing the method steps of an example of how to carry out the method for connecting two wafers in a planar manner for grinding down and cutting up a product wafer.

FIG. 3 is a flow diagram showing the steps of an example of a method for connecting two wafers in a planar manner for grinding down and cutting up a product wafer 1. In a first method step 50, the first covering film of the two covering films of a double-sided adhesive film 5 is removed. In the next method step 51, the exposed surface of the double-sided adhesive film 5 can be drawn onto the carrier wafer 2. This drawing of a double-sided adhesive film onto a carrier wafer may already be carried out fully automatically under a vacuum. The drawing of the double-sided adhesive film 5 onto the carrier wafer 2 is followed by method step 52, in which the carrier wafer 2 with the double-sided adhesive film is placed between the pins or positioning pins 23, 24 onto a chuck 4 of a semi-automatic machine, as shown in FIG. 1.

In the next step 53, the second covering film, which is still located on the double-sided adhesive film, can be removed from the latter. For this purpose, the carrier wafer 2 may already be fixed on the chuck 4 by evacuating the chuck 4. In step 54, the product wafer 1 to be ground is then sucked into place between the pins or guiding pins of the vacuum-chamber cover 18 of the semi-automatic machine, as shown in FIG. 1. After closing and evacuating the vacuum chamber 3 in step 55, the product wafer 1, which was held suspended from the vacuum-holding device 19, falls onto the adhesive surface of the double-sided adhesive film 5. By admitting air to the vacuum chamber 3, in method step 56, the product wafer 1 is deposited with its active surface 42 on the carrier wafer 2 via the double-sided adhesive film 5.

After removing the composite wafer produced in this way, including the product wafer 1 and the carrier wafer 2 with the double-sided adhesive film 5 lying in between, there may follow further method steps, for example, grinding down the product wafer, separating the product wafer and the carrier wafer, and cutting up the product wafer into chips. For this purpose, in method step 57 the wafer is ground down to <100 $\mu$m and in method step 58 the product wafer 1 is etched to a minimum of 40 $\mu$m. This minimum of 40 $\mu$m does not constitute a limit, but is reached in this example of how the method is carried out. Etching down can be carried out over a large surface area, even down to thicknesses of 15 $\mu$m and below. Subsequently, in method step 59, the wafer assembly including the product wafer 1 and the carrier wafer 2 is adhesively attached with the ground-down wafer 1 on a saw frame covered with film, with the double-sided adhesive film 5 lying in between. After that, separating the product wafer 1 and the carrier wafer 2 is performed using a heatable chuck 4, at 120° C. for example, in method step 60, and finally the ground-down product wafer 1 is sawn into chips in the saw frame covered with a film.

Apart from this example of how to carry out a method for connecting two wafers in a planar manner for grinding down and cutting up a product wafer 1 into chips, there are further variants, which have already been described above. In particular, with the device shown in FIG. 1, the pumping cross section can be varied during the closing and evacuating of the vacuum chamber in step 55 by using a lifting lead-through 32 in the vacuum base plate 29 of the device shown in FIG. 1 to make the chuck 4 be kept initially in a position away from the vacuum-holding device 19 and brought into position so that the distance a only has a few millimeters between the product wafer 1 and the carrier wafer 2 only shortly before the falling down of the product wafer 1.

The positioning of the positioning pins and of the guiding pins at the edges of the wafers may be variable and respectively adapted to the size and shape of the wafers to be connected. The cutting up of the product wafer 1 into chips may be performed before separating the product wafer 1 from the carrier wafer 2, so that, when the product wafer 1 is separated from the carrier wafer 2, this already has the effect that only chips are obtained for further processing. Other variations, obvious to a person skilled in the art, are possible without departing from the scope of invention as defined by the claims.

We claim:

1. A method for connecting a product wafer and a carrier wafer in a planar manner, which comprises:

attaching a double-sided adhesive film or an adhesive layer onto the carrier wafer;

placing the carrier wafer between positioning pins on a chuck of a vacuum chamber;

placing the product wafer between guiding pins of a vacuum-holding device of a vacuum-chamber cover and fixing the product wafer by opening a first vacuum valve connecting the vacuum-holding device to an evacuating device;

closing the vacuum chamber and evacuating the vacuum chamber to an equal or higher vacuum than a vacuum of the vacuum-holding device by opening a second vacuum valve; and after closing at least the first vacuum valve and the second vacuum valve and opening air-admitting orifices, admitting air into the vacuum chamber such that the carrier wafer and the product wafer are simultaneously pressed onto each other in a planar manner by rising pressure in the vacuum chamber.

2. The method according to claim 1, which further comprises:

providing the chuck as a heatable chuck;

performing the attaching step by attaching the adhesive film onto the carrier wafer; and after the carrier wafer and the product wafer have been pressed onto each other in a planar manner by the step of admitting air into the vacuum chamber, heating up the chuck in order to heat up the carrier wafer and the product wafer to a melting temperature of the adhesive film.

3. The method according to claim 1, which further comprises:

after the carrier wafer and the product wafer have been attached together in a planar manner by the step of admitting air into the vacuum chamber, grinding down the product wafer; and subsequently adhesively attaching the product wafer and the carrier wafer onto a saw frame covered with film.

4. The method according to claim 1, which further comprises separating the product wafer from the carrier wafer by heating the chuck above a release temperature of the adhesive film or the adhesive layer.

5. The method according to claim 4, which further comprises sawing the product wafer into chips.

6. The method according to claim 1, which further comprises, after the carrier wafer and the product wafer have been attached together in a planar manner by the step of admitting air into the vacuum chamber, grinding down the product wafer to a thickness below 100 micrometers.

7. The method according to claim 6, which further comprises, after performing the step of grinding down the product wafer, etching down the product wafer to a thickness of as little as 15 micrometers.

8. The method according to claim 6, which further comprises, after performing the step of grinding down the product wafer, cutting the product wafer into individual chips.

* * * * *